(12) United States Patent
Yang

(10) Patent No.: US 6,429,700 B1
(45) Date of Patent: Aug. 6, 2002

(54) DRIVER CIRCUIT WITH OUTPUT COMMON MODE VOLTAGE CONTROL

(75) Inventor: Jungwook Yang, West Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/836,153

(22) Filed: Apr. 17, 2001

(51) Int. Cl.$^7$ .................................................. H03K 3/00
(52) U.S. Cl. ........................... 327/108; 327/67; 330/258
(58) Field of Search ............................... 327/65–67, 77, 327/87, 89, 563; 330/252, 253, 258, 260

(56) References Cited

U.S. PATENT DOCUMENTS

| | | | |
|---|---|---|---|
| 5,436,594 A | 7/1995 | Pace et al. ................... 330/258 |
| 6,111,431 A | 8/2000 | Estrada ......................... 326/83 |
| 6,175,226 B1 | 1/2001 | Clerici et al. ................ 323/313 |
| 6,292,031 B1 * | 9/2001 | Thompson et al. ........... 327/66 |
| 6,297,698 B1 * | 10/2001 | Callahan, Jr. ................. 327/77 |
| 6,304,135 B1 * | 10/2001 | Muza .......................... 327/552 |

* cited by examiner

Primary Examiner—Kenneth B. Wells
(74) Attorney, Agent, or Firm—Paul J. Otterstedt; Ryan, Mason & Lewis, LLP

(57) ABSTRACT

A driver circuit having a minimized and/or controllable output common mode voltage comprises a differential amplifier having, a passive element as a biasing source for establishing a bias current in the differential amplifier and a control amplifier operatively coupled to the differential amplifier in a feedback arrangement, the control amplifier generating a control signal. The differential amplifier is responsive to the control signal for providing a voltage at an output of the driver circuit that is substantially independent of an input signal presented to an input of the driver circuit. By eliminating the need for an active device (e.g., transistor) as a bias current source, the output common mode voltage of the driver circuit is minimized. A reference signal coupled to the control amplifier, in conjunction with the feedback arrangement, substantially fixes the output common mode voltage of the driver circuit to a predetermined value.

13 Claims, 4 Drawing Sheets

US 6,429,700 B1

DRIVER CIRCUIT WITH OUTPUT COMMON MODE VOLTAGE CONTROL

FIELD OF THE INVENTION

The present invention relates generally to differential amplifier circuits, and more particularly relates to a differential amplifier having a low and controllable output common mode voltage.

BACKGROUND OF THE INVENTION

Differential amplifiers or gain stages are widely used today in many applications, such as high-speed output drivers. A basic function of a differential amplifier, in an idealized form, is to amplify only a difference between two input signals regardless of the common mode value of the signals. An electrical circuit diagram of a simple conventional differential amplifier 100, comprising a pair of bipolar junction transistors (BJT) Q1 and Q2 as an input stage, is shown in FIG. 1A. Since the emitters of the two input transistors Q1 and Q2 are connected together, this circuit configuration is often referred to as an emitter-coupled pair or differential pair.

FIG. 1A depicts one simple form of a conventional differential amplifier. The biasing circuit in the common emitter terminal 102, often referred to as the tail current source, can be either a simple resistor, in which case the equivalent current source 108 will be zero, or a transistor current source (shown in FIG. 1B), in which case the circuit represents a Norton equivalent of the transistor. A more detailed discussion of differential amplifiers in general may be found, for example, in the text by Alan B. Grebene entitled "Bipolar and MOS Analog Integrated Circuit Design," John Wiley & Sons (1984), which is incorporated herein by reference.

As shown in FIG. 1A, bias levels and gain characteristics of the differential amplifier 100 are primarily dependent on symmetry between the two branches 104, 106 of the circuit. This balanced nature of the differential amplifier makes it an ideal gain stage for integrated circuits, where close matching can be readily achieved using monolithic components. Another advantage of basic differential gain stages is that they can be directly coupled to one another without the need for extensive voltage level shifting and/or interstage coupling capacitors.

An important parameter in many amplifier designs is output common mode voltage. In general, output common mode voltage refers to the DC value upon which an AC output signal is superimposed, which directly affects, among other things, the output voltage swing of the amplifier.

Referring now to FIG. 1B, a conventional differential gain stage 110 is shown having a bias current circuit or source employing a BJT device Q1 and resistor R1, generally used for desensitizing the high transconductance of transistor Q1. A minimum value of the output common mode voltage at nodes OUT and OUTB for the differential amplifier 110 is primarily limited by the tail current source and a collector-emitter voltage ($V_{CE}$) of the input differential pair Q2 and Q3. Specifically, the minimum output signal level is determined, at least in part, by the voltage drop developed across resistor R1, a minimum collector-emitter voltage ($V_{CE}$) of the tail current source transistor Q1, and a minimum VCE of differential input transistors Q2 and Q3. This minimum output signal level is necessary to avoid operation in the saturation region of the transistor devices.

Since the differential amplifier 110 generally requires a large current in order to drive large capacitance loads typically encountered in output driver applications, the voltage drop across resistor R1 ($V_{R1}$) can easily be a few hundred millivolts (mV), typically around 300mV. Moreover, the collector-emitter voltage ($V_{CE,\,Q1}$) for the forward active region of operation for a typical bipolar transistor (e.g., Q1) is generally more than a few hundred millivolts, typically around 400 mV. By summing the above voltage drops (e.g., $V_{R1}$ and $V_{CE,\,Q1}$), it can be readily determined that the bias current source requires about 700 mV minimum in this example. Hence, comparatively low output common mode voltage (e.g., 300mV or below) is difficult to achieve using conventional circuit configurations, especially considering recent trends to lower the voltage supply rails in many applications.

With continued reference to the conventional differential amplifier of FIG. 1B, by eliminating the transistor Q1 in the current (e.g., by connecting resistor R1 directly to the common emitter node), the required common mode voltage can be reduced, at least by the collector-emitter voltage of transistor Q1. However, the bias current I1 flowing through bias resistor R1, which establishes the operating point of the amplifier, will be linearly dependent on the voltage across the resistor R1 (e.g., $I1=V_{EE}/R1$). Consequently, the bias current will be directly dependent upon the input signal presented to the differential amplifier 110. This is undesirable since the differential gain stage requires a constant current level for stable operation.

In order to reduce the output common mode voltage, other alternative conventional differential amplifier configurations may employ an additional negative voltage supply (e.g., below ground), other than the circuit return supply, to generate an output common mode voltage close to ground potential (e.g., zero volts). From a system standpoint, the inclusion of another power domain is very costly.

Accordingly, there exists a need for a circuit biasing arrangement which provides a reduced output common mode voltage of the circuit. Moreover, it would be desirable to provide selective control of the output common mode voltage.

SUMMARY OF THE INVENTION

The present invention provides a driver circuit having a minimized and/or controllable output common mode voltage. The output common mode voltage of the driver is reduced by utilizing a passive element as a bias current source included in the circuit, thus eliminating the need for an active device (e.g., transistor) as is conventionally employed. In order to reduce an undesirable effect associated with using only a passive element as the bias current source of the circuit, namely, the output common mode voltage varying proportionally with an input signal presented to the circuit, the invention includes a current biasing arrangement for providing a common mode output voltage which is substantially independent of the input voltage presented to the driver circuit. Hence, the present invention provides a minimized and stable output common mode voltage.

In accordance with one aspect of the invention, a driver circuit having a minimized output common mode voltage comprises a differential amplifier and a control amplifier operatively coupled thereto in a feedback arrangement. The differential amplifier includes a bias circuit having a passive element (e.g., a resistor) for establishing a bias current in the differential amplifier. The control amplifier senses a voltage corresponding to an output voltage of the differential amplifier and operatively adjusts the bias current flowing through the differential amplifier so that the output common mode voltage of the differential amplifier substantially matches a predetermined reference voltage coupled to the control amplifier.

In an illustrative embodiment of the invention, a driver circuit having a minimized and controllable output common mode voltage comprises a differential output amplifier, a common mode amplifier and a control amplifier. The differential output amplifier includes first and second inputs, and first and second outputs forming a differential output of the driver circuit. The common mode amplifier includes first and second inputs forming a differential input of the driver circuit, and first and second outputs, the first and second outputs of the common mode amplifier being coupled to the first and second inputs, respectively, of the differential output amplifier. The control amplifier includes a first input for receiving a reference signal coupled thereto, a second input for receiving a voltage corresponding to an output voltage from the driver circuit, and an output coupled to the common mode amplifier, the control amplifier being operatively connected in a feedback arrangement in accordance with the common mode amplifier and at least partially controlling an output common mode voltage of the driver circuit in response to a difference between the reference signal and the voltage corresponding to an output voltage from the driver.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be explained below in the context of an illustrative driver circuit. However, it should be understood that the present invention is not limited to this or any particular driver circuit. Rather, the invention is more generally applicable to any suitable circuit in which it is desirable to minimize and/or control the output common mode voltage of the circuit while providing an output voltage that is substantially independent of an input voltage presented to the circuit. Moreover, although implementations of the present invention are described herein using npn bipolar junction transistor (BJT) devices, it is to be appreciated that the present invention is not limited to such devices, and that other suitable devices, such as, for example, pnp BJT devices or metal oxide semiconductor (MOS) devices, may be similarly employed, with or without modifications to the circuit, as understood by those skilled in the art.

Figure 2:
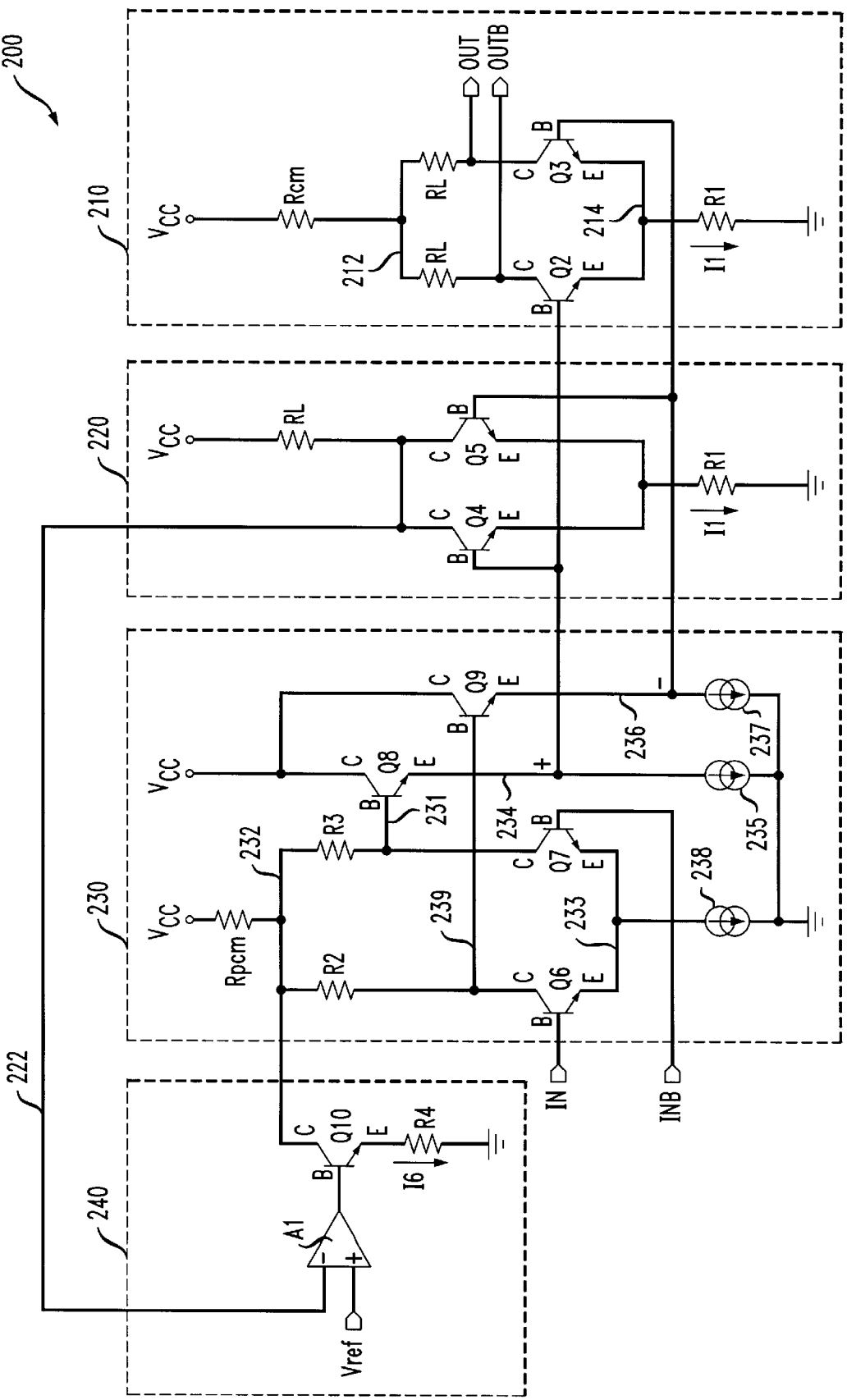
FIG. 2 is an electrical schematic diagram illustrating a driver circuit including replica biasing and output common mode voltage control, in accordance with the present invention.

FIG. 2 illustrates a driver circuit 200 having a minimized and/or controllable output common mode voltage in accordance with one aspect of the present invention. The driver circuit 200 includes a positive or non-inverting input IN, a negative or inverting input INB, a positive or non-inverting output OUT and a negative or inverting output OUTB. Thus, the driver may be considered a differential input/differential output driver. If the driver circuit is to be utilized in a single-ended mode of operation, only one output is required (e.g., either OUT or OUTB). Furthermore, the illustrative driver circuit 200 includes a control voltage input Vref for operatively controlling an output common mode voltage of the driver circuit 200 in response to an external control or reference signal connected thereto. The present invention similarly contemplates that the control signal may be generated internal to the driver circuit and, if no control over the output common mode voltage is desired, the signal may be fixed at a predetermined voltage, in which case the Vref input may be eliminated.

For ease of explanation, the exemplary driver circuit 200 may be grouped according to functional sub-circuits or stages, including a differential output stage 210, a replica bias circuit 220, a common mode amplifier stage 230 and a control amplifier circuit 240. Each of these sub-circuits is described in detail herein below. It is to be appreciated that certain of these functional sub-circuits may be combined or incorporated into another functional sub-circuit. For example, the replica bias circuit 220 may be incorporated into the differential output stage 210. In this manner, components may be operatively shared in order to eliminate redundancy.

As shown in FIG. 2, the differential output stage 210 may be implemented, for example, as a differential amplifier or gain stage having a positive or non-inverting input 234, a negative or inverting input 236 and two outputs, OUT and OUTB, forming the differential outputs of the driver circuit 200. The differential output stage 210 includes two npn transistors, Q2 and Q3, connected in a common-emitter arrangement with a common emitter node at 214. The differential output stage 210 further includes a bias or tail current source comprising a bias resistor R1 operatively coupled between the common emitter node 214 and a negative voltage supply node, which is preferably ground as shown. The collector terminal of each transistor Q2, Q3 is coupled to a load, which may be a resistor RL (as shown), with the junction of the collector terminal of each transistor Q2, Q3 and corresponding load RL forming the outputs OUTB and OUT, respectively, of the driver circuit 200. The load resistors RL coupled to transistors Q2 and Q3 are substantially matched in value at least in part to reduce the effect of offset. As known by those skilled in the art, each load may also be an active device which can be implemented, for example, as a transistor and associated bias voltage in place of each load resistor RL.

The ends of the two load resistors RL opposite the output nodes OUT, OUTB are connected together at node 212. A common mode resistor, Rcm, preferably connects node 212 to a positive voltage supply, Vcc. By selecting the effective resistance value of the common mode resistor Rcm, the common mode voltage of the differential output stage 210. may be set as desired. It is to be appreciated that differential output stage 210 may similarly employ an active device (e.g., a transistor), operatively coupled to an appropriate bias voltage source (not shown), in place of resistor Rcm, as understood by those skilled in the art.

Figure 1A:
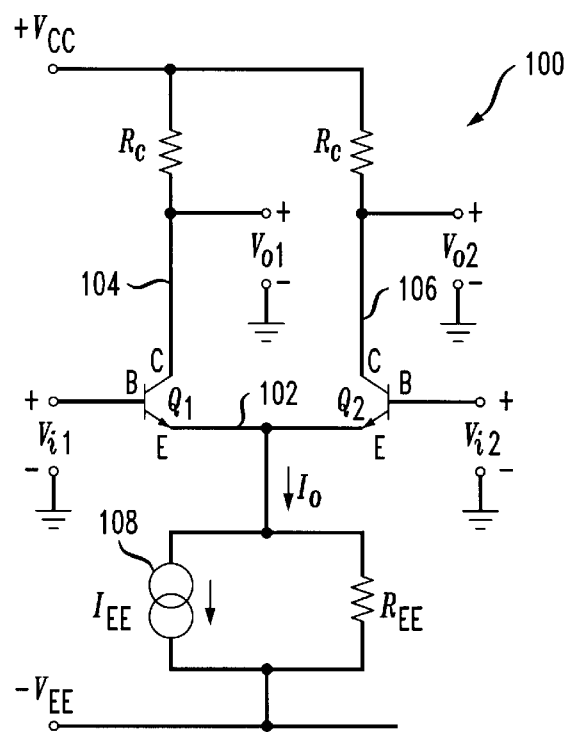
FIG. 1A is an electrical schematic diagram illustrating a conventional differential amplifier employing a generic bias current source.
Figure 1B:
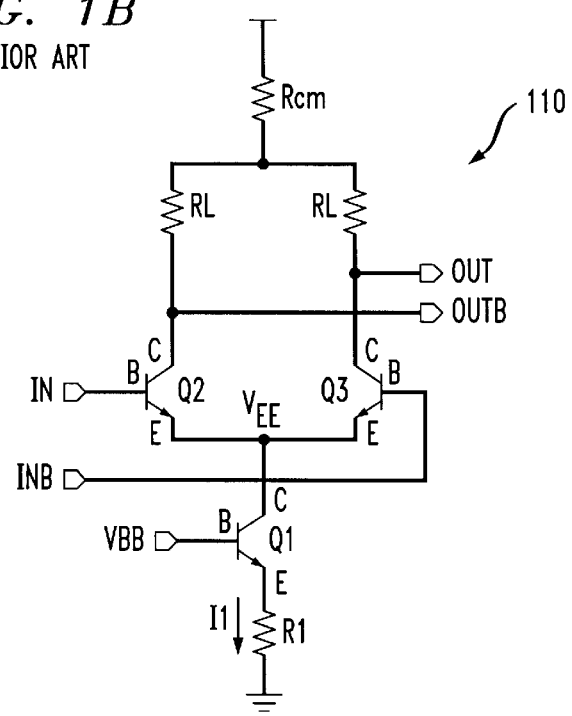
FIG. 1B is an electrical schematic diagram illustrating a conventional differential amplifier employing a transistor bias current source.

In order to minimize the output common mode voltage necessary to sustain a desired non-saturation region operation of the differential output stage 210, the bias circuit which establishes a tail current in the differential amplifier employs a passive element (e.g., resistor R1), thereby eliminating the use of an active device as conventionally employed (such as Q1 in FIG. 1B). As stated previously herein, a disadvantage with conventional differential amplifier designs employing only a resistor as the tail current source is that the bias or tail current will vary proportionally with the input voltage swing presented to the amplifier. Thus, the common mode voltage at the output terminals of the amplifier will also vary significantly. The novel architecture of the present invention, however, utilizes a feedback control loop in accordance with common mode amplifier 230 and control amplifier 240 which substantially fixes the output common mode voltage. of the driver circuit at a predetermined level, regardless of the voltage appearing at the input terminals of the driver circuit 200, as will be explained in further detail herein below.

With continued reference to the exemplary driver circuit 200 of FIG. 2, a common mode amplifier 230 is coupled to and drives the inputs 234, 236 of the differential output stage 210. The common mode amplifier 230 operatively controls a common mode voltage of the. driver circuit, at least in part by controlling a voltage at the inputs 234, 236 of the differential output stage 210. The common mode amplifier 230 includes a differential input stage which may be operatively coupled to an output or buffer stage. For example, the differential input stage of the common mode amplifier 230 may be connected similar to differential output stage 210. Common mode amplifier 230, for instance, may comprise npn input transistors Q6 and Q7 connected in a common-emitter arrangement with a common emitter node at 233, load resistors R2, R3 and Rpcm, and a tail current source 238. The base terminals of transistors Q6 and Q7 form the differential inputs IN and NB, respectively, of the driver circuit 200. The differential input stage of the common mode amplifier 230 further includes a positive output node 231 and a negative output node 239 formed at the collector terminals of transistors Q7 and Q6, respectively.

The bias current source 238 of the common mode amplifier 230 may be implemented as a simple resistor (e.g., as employed by the differential output stage 210) or it may be an active device, such as a transistor coupled to an appropriate bias voltage source (not shown). Each of the input transistors Q6 and Q7 includes a corresponding load resistance, R2 and R3, respectively, coupled at a first end to the collector terminal of the respective transistor device and coupled together at node 232 at a second end of the resistor. Resistors R2 and R3 are substantially matched to each other in value at least in part to reduce offset error. A common mode resistor, Rpcm, connects node 232 to the positive voltage supply Vcc. The common mode voltage of the input differential stage may be selectively set to a predetermined value by choosing an effective resistance value of the common mode resistor Rpcm. It is to be appreciated that load resistors R2, R3 and common mode resistor Rpcm may be similarly implemented as active devices (e.g., transistors) in a conventional manner, as understood by those skilled in the art.

As noted above, the common mode amplifier 230 may include an output or buffer stage, e.g., comprising npn transistors Q8, Q9 and corresponding bias current sources 235, 237, respectively. Although the output stage of the common mode amplifier 230 may provide gain, the buffer stage advantageously minimizes output impedance so that the voltage gain of the common mode amplifier 230 is relatively unaffected by the value of load impedance of a subsequent circuit or component coupled thereto. In the exemplary circuit of FIG. 2, transistors Q8 and Q9 are configured as emitter followers providing substantially unity gain. Each emitter follower device Q8, Q9 is biased to a quiescent operating point by a corresponding current source 235, 237, respectively, and is driven by the voltages at nodes 231 and 239, respectively. Current sources 235, 237 may be implemented in a conventional manner, for example, as resistors or active devices (e.g., transistors), as understood by those skilled in the art. The junction of the emitter of each transistor device Q8, Q9 and corresponding current source 235, 237, respectively, forms the positive and negative outputs 234, 236, respectively, of the common mode amplifier 230.

With continued referenced to FIG. 2, the exemplary driver circuit 200 preferably includes a replica bias circuit 220. The replica bias circuit 220 is operatively configured to substantially replicate the quiescent operating point and characteristics of the differential output stage 210 and functions, at least in part, to closely approximate an output voltage swing at the output load resistor RL of the differential output stage 210, essentially without loading any of the internal nodes of the differential output stage. In this regard, the sizes and values of the components comprising the replica bias circuit 220 are ideally chosen to match corresponding components in the differential output stage 210. For example, bias resistors R1 in the replica bias circuit 220 and differential output stage 210 are preferably matched in resistance values, as are the load resistors RL in the two circuits substantially matched to each other. Likewise, the input differential pair of the replica bias circuit 220 (e.g., comprising transistors Q4 and Q5), ideally matches the input differential pair in the differential output stage 210 (e.g., comprising transistors Q2 and Q3, respectively). To further provide accurate temperature tracking between the differential output stage 210 and the replica bias circuit 220, corresponding components of the two circuits may be placed in close relative proximity to each other on a semiconductor die.

The replica bias circuit 220 is preferably modified, as compared to the differential output stage 210, so that the collector terminals of the input differential pair Q4, Q5 are connected together at node 222, in essence representing the output voltage swing of the driver circuit 200. Load resistor RL connects node 222 to the positive voltage supply Vcc. The base terminals of the differential pair transistors Q4, Q5 are preferably coupled to outputs 234, 236, respectively, of the common mode amplifier 230. With the input voltage presented to the differential pairs of the differential output stage 210 and the replica bias circuit 220 being substantially the same (since they are connected together), and since the bias resistor R1 of the differential output stage 210 is substantially matched to the bias resistor R1 of the replica bias circuit 220, the bias current I1 flowing through the two circuits 210, 220, and thus the quiescent operating point of the two circuits, will be substantially the same.

As shown in FIG. 2, the driver circuit 200 includes a control amplifier 240 for controlling the output common mode voltage of the driver circuit. The control amplifier 240 is operatively connected in a feedback arrangement between the replica bias circuit 220 and the common mode amplifier 230. The control amplifier 240 senses the voltage swing at node 222 of the replica bias circuit 220, which closely tracks and is representative of the output voltage swing of the driver circuit 200, and operatively adjusts a bias current flowing through the common mode resistor Rpcm of the common mode amplifier 230 until the voltage at node 222 is substantially equal to a reference voltage, Vref, applied to an input (e.g., a positive or non-inverting input) of the control amplifier 240. As noted herein above, since the replica bias circuit 220 is configured to substantially match the quiescent operating point of the differential output stage 210, controlling the voltage at node 222 essentially translates to controlling the common mode voltage at the output nodes OUT, OUTB of the driver circuit 200 such that bias current I1 in the differential output stage 210 produces an appropriate voltage swing across resistors RL, which substantially corresponds to the voltage Vref.

The control amplifier 240 may include a differential amplifier A1, such as, for example, an operational amplifier (op-amp) or a suitable alternative thereof, operatively coupled to an output stage. In the exemplary circuit depicted in FIG. 2, the output stage of the control amplifier 240 is preferably a voltage-to-current converter, for example, comprising a npn transistor Q10 and a current biasing resistor R4 connected thereto, although other suitable circuit implementations are similarly contemplated by the present invention. The bias resistor R4 is connected between the emitter terminal of transistor Q10 and the negative voltage supply and, in conjunction with an output voltage from the differential amplifier A1 applied to the base terminal of transistor Q10, establishes a bias current 16 which is substantially equal to an output current sink flowing into the collector terminal of transistor Q10.

The output stage of the control amplifier 240 is preferably coupled to node 232 of the common mode amplifier 230 and operatively provides a current sink that at least partially controls the operating point of the common mode amplifier 230. A negative or inverting input of the control amplifier 240 is preferably coupled to node 222 for sensing the voltage corresponding to the output voltage swing of the driver circuit 200, as explained herein above, thus closing a feedback loop around node 222 and node 232.

When the measured output voltage at node 222 of the replica bias circuit 220 rises above the reference voltage Vref, the voltage at the output of the differential amplifier A1 will decrease causing current 16 to decrease accordingly. With the control amplifier 240 sinking less current from the common mode amplifier at node 232, there will be more current flowing through load resistors R2 and R3. Hence, a greater voltage drop will develop across resistors R2 and R3, thereby causing the common mode voltage at nodes 234, 236 be reduced. The opposite is true when the measured voltage at node 222 is smaller than the reference voltage Vref. Thus, the output common mode voltage of the driver circuit is kept substantially fixed, independent of the voltage appearing at the input of the common mode amplifier 230.

In an example application of the present invention, the non-inverting input of differential amplifier A1 is connected to a reference voltage, Vref, which represents a desired logic voltage swing, Vswing, such that Vref=Vcc−Vswing. When Vcc is equal to five volts and Vswing is equal to 0.4 volts, Vref is preferably set to 4.6 volts. It is to be appreciated that the voltage at node 222 can be offset by a predetermined amount, such as by employing a level shift circuit (not shown), in order to lower (or raise, as desired) the voltage presented to the control amplifier 240, thereby relieving the input common mode range (CMR) requirement of differential amplifier A1. If such offset is used, the reference voltage Vref must be offset by the same amount. Using this exemplary architecture of the present invention, the output common mode voltage of the driver circuit 200 can be reduced by at least the minimum collector-emitter voltage VCE of a transistor device (e.g., typically about 400 mV) while still providing a stable and controllable common mode output voltage.

As explained herein above, the reference voltage Vref, in conjunction with the feedback arrangement comprising control amplifier 240 and common mode amplifier 230, operatively defines the bias current I1 in the differential output stage 210 and hence the output voltage swing across the output nodes OUT, OUTB of the differential output stage 210. Once the bias current I1 has been determined for producing a desired output voltage swing, the output common mode voltage of the differential output stage 210 can be set by choosing an appropriate value for the common mode resistor Rcm. The output voltage swing Vswing can be written as:

$$Vswing = RL \cdot I1 \tag{1}$$

The desired output common mode voltage Vcm at the outputs OUT, OUTB of the differential output stage 210 can be determined as:

$$Vcm = Vcc - \left(Rcm + \frac{RL}{2}\right) \cdot I1 \tag{2}$$

Solving for I1 in equation (1) and substituting into equation (2) above yields:

$$Vcm = Vcc - \left(Rcm + \frac{RL}{2}\right) \cdot \frac{Vswing}{RL} \tag{3}$$

Hence, the resistance Rcm required to establish a predetermined common mode voltage Vcm may be obtained using equation (3) above as:

$$Rcm = (Vcc - Vcm) \cdot \frac{RL}{Vswing} - \frac{RL}{2} \tag{4}$$

Figure 3:
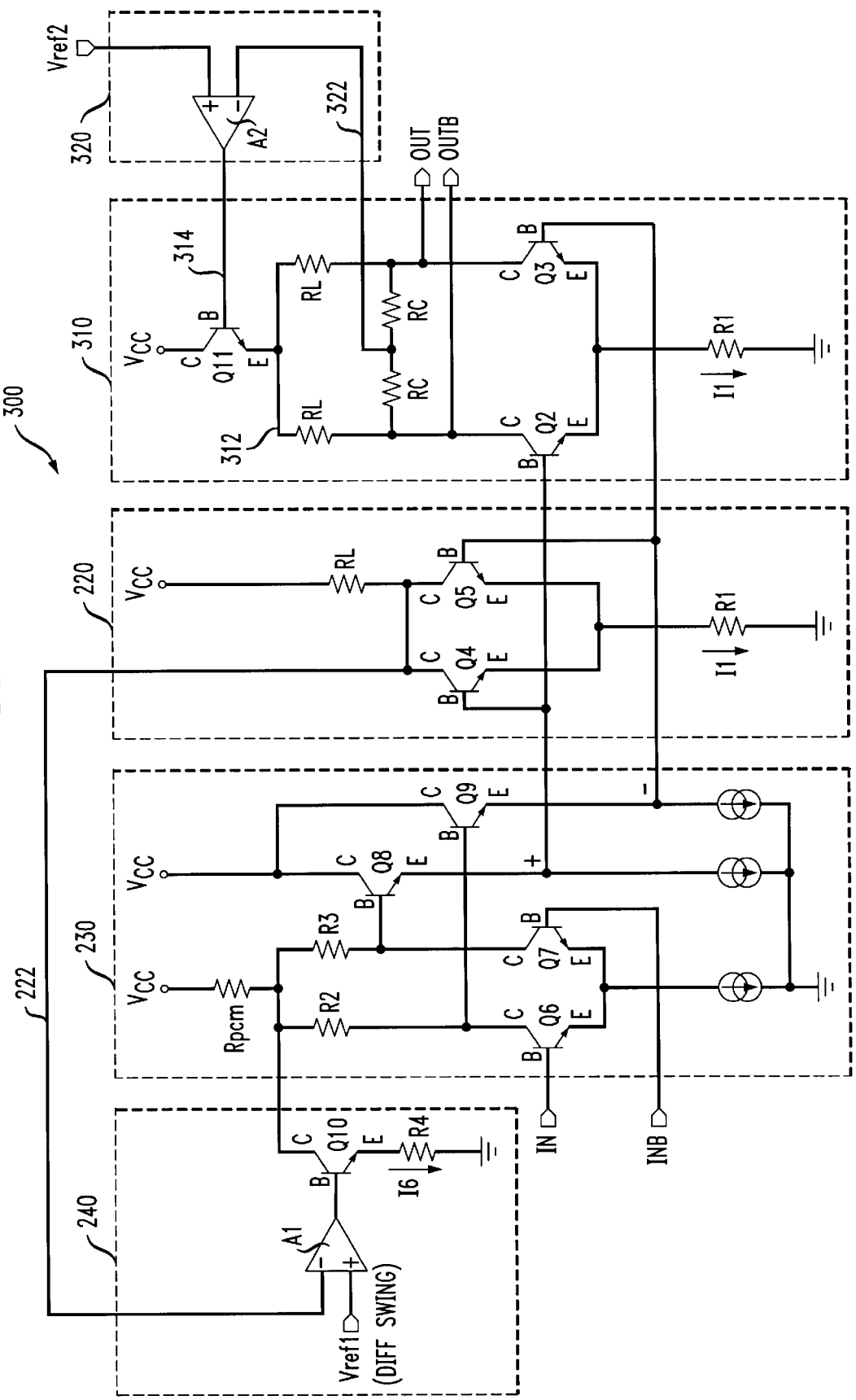
FIG. 3 is an electrical schematic diagram illustrating a driver circuit employing a two feedback control paths for output common mode voltage control, in accordance with the present invention.

With reference now to FIG. 3, a modification to the driver circuit of FIG. 2 is illustrated, in accordance with the present invention. As shown in FIG. 3, an exemplary driver circuit 300 preferably includes a differential output stage 310, a replica bias circuit 220, a common mode amplifier 230, a first control amplifier 240, and a second control amplifier 320. It is to be appreciated that the replica bias circuit 220, common mode amplifier 230 and first control amplifier 240 may be the same as previously described herein in conjunction with FIG. 2. Additionally, these functional sub-circuits are preferably coupled to each other in the same manner as described previously herein. The second control amplifier 320 is preferably added to the driver circuit 300 for substantially fixing the common mode voltage at the outputs OUT, OUTB, regardless of the input voltage to the driver circuit. Control amplifier 320 preferably comprises a differential amplifier A2, which may be implemented as a conventional operational amplifier or a suitable alternative thereof.

The control amplifier 320 preferably establishes a feedback control loop within the differential output stage 310. To accomplish this, a modification is preferably made to the differential output stage 310, as compared to the differential output stage 210 of FIG. 2, whereby the common mode resistor Rcm in FIG. 2 is replaced by an active device, for example, an npn transistor Q11. Common mode control transistor Q11 is preferably connected as an emitter follower, with its emitter terminal coupled to the load resistors RL at node 312, its collector terminal coupled to the positive voltage supply Vcc and its base terminal coupled to an output 314 of the differential amplifier A2.

With continued reference to FIG. 3, the output common mode voltage of the driver circuit 300 may be extracted, in accordance with one aspect of the invention, by averaging the output nodes OUT, OUTB using a pair of resistors RC of substantially equal value. Resistors RC are preferably connected directly across the differential output nodes OUT, OUTB, with a center tap being formed at node 322 for representing an average of the output voltage of the driver circuit 300. Preferably, the resistance of RC is chosen to be substantially high (e.g., 1M ohms) in order to effectively isolate node 322 so as not to disrupt the DC bias condition or AC loading in the driver circuit 300.

The differential amplifier A2 preferably senses (e.g., at an inverting input of differential amplifier A2) a voltage at node 322 and attempts to force this voltage to be substantially equal to a predetermined reference voltage, Vref2, which is applied, for instance, to a non-inverting or positive input of differential amplifier A2, to set the common mode voltage of-the driver circuit 300. A feedback loop is thereby established around nodes 322 and 312. For example, when the measured voltage at node 322 is determined to be less than the reference voltage Vref2, the output 314 of the differential amplifier A2 will increase and the common mode voltage at the outputs OUT, OUTB of the driver circuit 300 will rise proportionally. Likewise, when the voltage at node 322 is determined to be greater than reference voltage Vref2, the output of the differential amplifier A2 will decrease and the output common mode voltage will fall proportionally. It is to be appreciated that the reference voltage Vref2 may be generated external to the driver circuit 300 or it may generated internally, as understood by those skilled in the art.

For LVDS (low voltage differential signal) applications, the required output common mode voltage is typically around 1.2 volts. In this case, a bandgap reference source may be utilized to generate a temperature-independent and supply-independent reference voltage Vref2 for setting the common mode output voltage of the driver circuit 300 to be about 1.2 volts.

Figure 4:
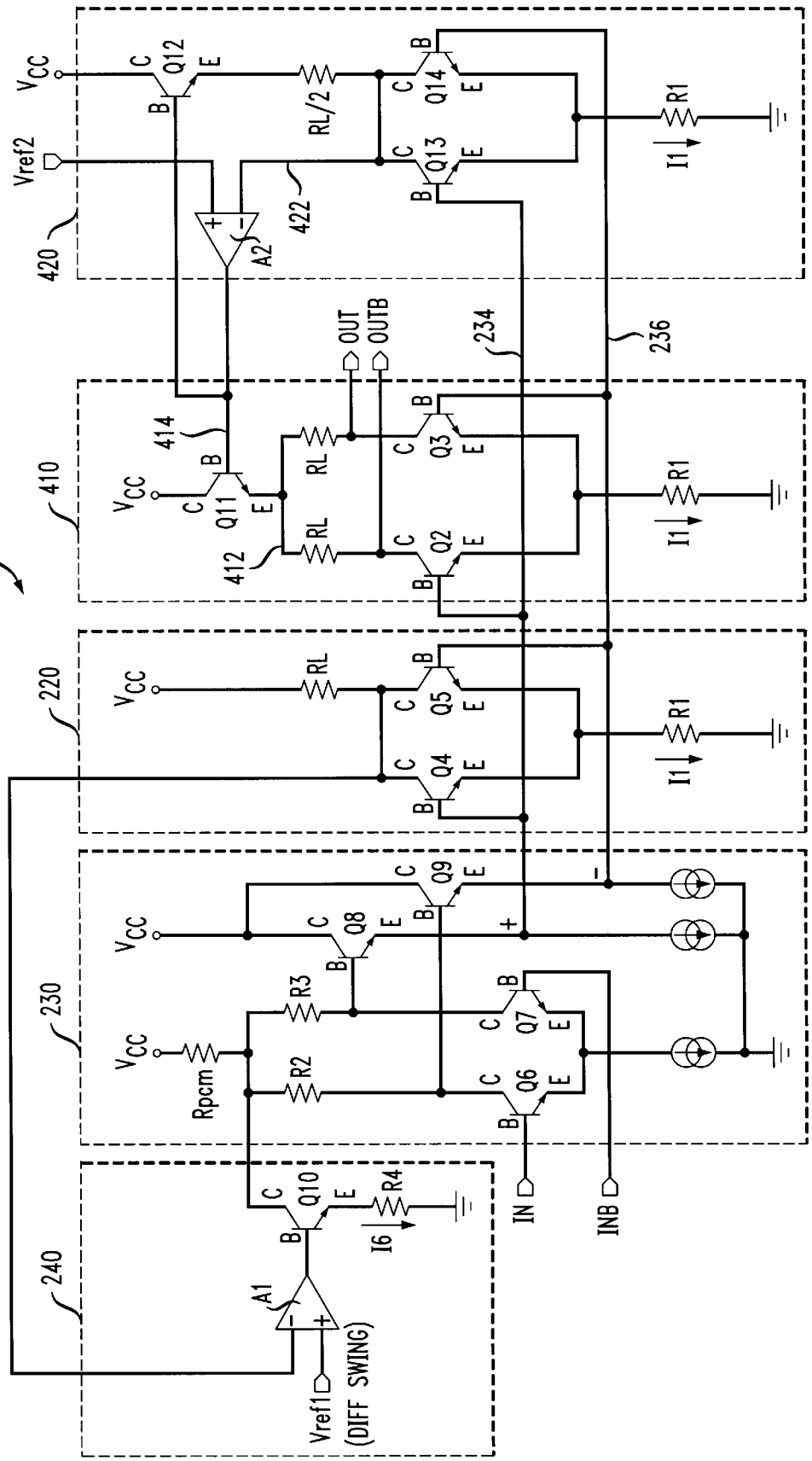
FIG. 4 is an electrical schematic diagram illustrating an alternative to the driver circuit of FIG. 3, in accordance with the present invention.

Referring now to FIG. 4, a modification to the driver circuit of FIG. 3 is illustrated, in accordance with another aspect of the present invention. As shown in FIG. 4, the illustrative driver circuit 400 includes a differential output stage 410, a replica bias circuit 220, a common mode amplifier 230, a first control amplifier 240 and a second control amplifier 420. It is to be appreciated that the replica bias circuit 220, common mode amplifier 230 and first control amplifier 240 may be the same as previously described herein in conjunction with FIG. 2. Moreover, these functional sub-circuits are preferably coupled together in the same manner as previously described herein.

The differential output stage 410 of the driver circuit 400 may be similar to the differential output stage 310 described above and depicted in FIG. 3, with the exception that the voltage averaging resistors RC are preferably eliminated. Other suitable circuit architectures for implementing the differential output stage 410 are also contemplated by the invention. As in differential output stage 310 (see FIG. 3), a common mode control transistor Q11 is configured as an emitter follower, with an emitter terminal coupled to a junction of load resistors RL at node 412 and a collector terminal coupled to the positive voltage supply Vcc. Transistor Q11 is responsive to a control signal or voltage coupled to the base terminal 414 of Q11. The control signal is preferably generated by the second control amplifier 420 and may be used to operatively control the output common mode voltage at nodes OUT, OUTB of the differential output stage 410.

The second control amplifier 420 may be implemented as a variant of control amplifier 320 shown in FIG. 3. For example, in order to provide a voltage corresponding to an average of the output common mode voltage of differential amplifier 410, a replica bias circuit is preferably added to the control amplifier 420. This replica bias circuit is operatively coupled to an input (e.g., inverting input) of a differential amplifier A2 in control amplifier 420 and comprises an input differential pair (e.g., npn transistors Que. and Q14), tail current bias resistor R1, load resistor RL/2 and npn transistor Q12. By employing replica biasing in the control amplifier 420, resistors RC (see FIG. 3) may be omitted from the differential output stage 410, as noted above. By eliminating the averaging resistors RC in the differential output stage 410, this arrangement significantly enhances the frequency stability of the second feedback loop comprising differential amplifier A2 and common mode transistor Q11.

The replica bias circuit in second control amplifier 420 described above is preferably similar to replica bias circuit 220, at least in terms of circuit architecture and function, and closely replicates the operation of the differential output stage 410 primarily for the purpose of sensing an average output common mode voltage of the driver circuit 400. In this regard, differential pair Que., Q14 in control amplifier 420 is substantially matched to differential pair Q2, Q3, respectively, in differential output stage 410. Furthermore, the tail current bias resistors R1 in both the control amplifier 420 and differential output stage 410 are substantially matched. As stated herein above in conjunction with FIG. 2, in order to provide accurate temperature tracking between the differential output stage 410 and the replica bias circuit in control amplifier 420, corresponding components of the two circuits may be placed in close relative proximity to each other on a semiconductor die.

With continued reference to FIG. 4, the collector terminals of the input differential pair Q13, Q14 of the replica bias circuit are preferably connected together at node 422, in essence representing an average of the common mode output voltage of the driver circuit 400. Load resistor RL/2 connects node 422 to the emitter terminal of transistor Q12, which is preferably matched to transistor Q11. Since transistors Que. and Q14 are coupled together with their emitter and collector terminals in parallel, bias current I1 will continuously flow through resistor RL/2, thus representing the output common mode voltage of the differential output stage 410. Therefore, in order to keep the voltage drop across the load resistor RL/2 in the control amplifier 420 half that of the load resistors RL in the differential output stage 410, the resistance value of load resistor RL/2 in control amplifier 420 is ideally chosen to be half the resistance value of load resistors RL in the differential output stage 410, as the reference designation presumes.

As in the case of replica bias circuit 220, the base terminals of the differential pair transistors Que., Q14 are preferably coupled to outputs 234, 236, respectively, of the common mode amplifier 230. With the input voltage presented to the differential pairs of the differential output stage 410 and the second control amplifier 420 being substantially the same (since they are connected together), and since the bias resistor R1 of the differential output stage 410 is substantially matched to the bias resistor R1 of the control amplifier 420, the bias current I1 flowing through the two circuits 410, 420, and thus the quiescent operating point of the two circuits, will be substantially the same.

As stated above, transistor devices Q11 and Q12 are preferably matched to each other and connected so that the base terminals of each device are coupled to the output of differential amplifier A2. at node 414. Consequently, the current flowing into the differential pair loads RL and RL/2 of the differential output stage 410 and control amplifier 420, respectively, is controlled, at least in part, by the differential amplifier A2. Since the internal nodes of the replica bias circuit in the second control amplifier 420 are configured to substantially match corresponding internal nodes of the differential output stage 410, the current flowing into each load resistor RL should closely match the current flowing into load resistor RL/2, as understood by those skilled in the art.

As in the case of control amplifier 320 in FIG. 3, the differential amplifier A2 in second control amplifier 420 preferably senses a voltage (e.g., coupled to an inverting or negative input of amplifier A2) at node 422, representing an average output common mode voltage of the driver circuit 400, and attempts to force this voltage to be substantially equal to a predetermined reference voltage, Vref2, which is applied, for instance, to a non-inverting input of differential amplifier A2, thereby operatively controlling the common mode voltage of the driver circuit 400. It is to be appreciated that reference voltage Vref2 may be generated either external to the driver circuit 400, or it may be generated internally, such as, for example, with a bandgap reference (not shown) included in the driver circuit 400. In accordance with the invention, a feedback loop is thus established between the differential output stage 410 and the second control amplifier 420.

By way of illustration, when the measured voltage at node 422 (e.g., at the inverting input of amplifier A2) is determined to be less than the reference voltage Vref2 (e.g., at the non-inverting input of amplifier A2), the output 414 of differential amplifier A2 will increase and the common mode voltage at the outputs OUT, OUTB of the driver circuit 400 will increase proportionally. Likewise, when the voltage at node 422 is determined to be greater than reference voltage Vref2, the output of the differential amplifier A2 will decrease and the output common mode voltage will decrease proportionally.

In the manner thus described, the present invention provides, in at least one aspect, a driver circuit which has a minimized output common mode voltage by eliminating the need for an active device (and thus the voltage drop associated therewith) as a bias current source in a differential amplifier included in the driver circuit. In place of the active device as the bias current source, the present invention employs a passive circuit element, preferably a resistor, in the differential amplifier. A control amplifier operatively coupled to the differential amplifier in a feedback arrangement provides a voltage at an output of the driver circuit that is substantially independent of an input signal presented to the driver circuit. Moreover, the driver circuit, in accordance with another aspect of the invention, preferably includes at least one input for receiving a control signal for operatively adjusting the output common mode voltage of the driver circuit to a desired level.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A driver circuit having a minimized output common mode voltage, the driver circuit comprising:
   a differential amplifier having a passive element as a biasing source for establishing a bias current in the differential amplifier;
   a control amplifier operatively coupled to the differential amplifier in a feedback arrangement, the control amplifier generating a control signal; and
   a common mode amplifier including first and second inputs forming a differential input of the driver circuit, the common mode amplifier being operatively coupled to an output of the control amplifier and having at least one output coupled to an input of the differential amplifier, the common mode amplifier at least partially establishing an output common mode voltage of the driver circuit at a predetermined voltage level in response to the control signal from the control amplifier;
   wherein the differential amplifier is responsive to the control signal for providing a common mode voltage at an output of the driver circuit that is substantially independent of an input signal presented to the differential input of the driver circuit.

2. The driver circuit of claim 1, wherein:
   the differential amplifier includes an input differential pair and a corresponding load device operatively coupled to the input differential pair; and
   the control amplifier includes a first input for receiving a-reference signal and a second input for receiving a voltage corresponding to at least a portion of the output of the driver circuit, the control signal generated by the control amplifier corresponding to a difference between the reference signal and the voltage corresponding to at least a portion of the output of the driver circuit, the control amplifier operatively controlling a current flowing through the load device in the differential amplifier in response to the control signal;
   whereby the reference signal at least partially controls an output voltage swing of the driver circuit.

3. The driver circuit of claim 1, further comprising:
   a replica bias circuit operatively coupled to the differential amplifier, the replica bias circuit generating a voltage corresponding to at least a portion of the output of the driver circuit, wherein the control signal generated by the control amplifier represents a difference between a reference voltage coupled to an input of the control amplifier and the voltage corresponding to at least a portion of the output of the driver circuit.

4. The driver circuit of claim 1, further comprising a second control amplifier, the second control amplifier including a first input for receiving a reference signal coupled thereto, a second input for receiving a voltage corresponding to at least a portion of the output of the driver circuit, and an output, the second control amplifier being operatively coupled to the differential amplifier in a feedback arrangement and at least partially establishing the output common mode voltage of the driver circuit in response to a difference between the reference signal coupled to the second control amplifier and the voltage corresponding to at least a portion of the output of the driver circuit.

5. The driver circuit of claim 4, wherein the second control amplifier comprises:

a replica bias circuit operatively coupled to the differential amplifier, and having an output corresponding to at least a portion of the output of the driver circuit; and a second differential amplifier including a first input coupled to the output of the replica bias circuit, a second input for receiving the reference signal, and an output coupled to the differential amplifier, the second differential amplifier at least partially controlling the output common mode voltage of the driver circuit in response to a difference between the reference signal coupled to the second control amplifier and the voltage corresponding to at least a portion of an output of the driver circuit.

6. An amplifier circuit having a minimized output common mode voltage, the amplifier circuit comprising:

a differential output amplifier including first and second inputs, and first and second outputs forming first and second outputs, respectively, of the amplifier circuit, the differential output amplifier having a passive element as a bias source for establishing a bias current in the differential output amplifier;

a common mode amplifier including first and second inputs forming first and second inputs, respectively, of the amplifier circuit, and first and second outputs, the first and second outputs of the common mode amplifier being coupled to the first and second inputs, respectively, of the differential output amplifier; and a control amplifier including a first input for receiving a reference signal coupled thereto, a second input for receiving a voltage corresponding to an output of the amplifier circuit, and an output operatively connected to the common mode amplifier in a feedback arrangement, the control amplifier generating a control signal for at least partially controlling an output voltage swing of the amplifier circuit in response to a difference between the reference signal and the voltage corresponding to an output of the amplifier circuit;

wherein the differential output amplifier is responsive to the common mode amplifier for providing a voltage at the outputs of the amplifier circuit that is substantially independent of an input signal presented to the inputs of the amplifier circuit.

7. The amplifier circuit of claim 6, further comprising:

a replica bias circuit operatively coupled to the differential output amplifier, the replica bias circuit generating the voltage corresponding to an output of the amplifier circuit.

8. The amplifier circuit of claim 6, wherein:

the common mode amplifier comprises an input differential amplifier including an input differential pair operatively coupled to a corresponding load device; and the control signal from the control amplifier controls a bias current flowing through the load device for establishing, at least in part, an output common mode voltage of the amplifier circuit.

9. The amplifier circuit of claim 6, further comprising:

a second control amplifier, the second control amplifier including a first input for receiving a reference signal coupled thereto, a second input for receiving a voltage corresponding to an output of the amplifier circuit, and an output, the second control amplifier being operatively coupled to the differential output amplifier in a feedback arrangement and at least partially establishing an output common mode voltage of the amplifier circuit in response to a difference between the reference signal coupled to the second control amplifier and the voltage corresponding to an output of the amplifier circuit.

10. The amplifier circuit of claim 9, wherein the second control amplifier comprises:

a replica bias circuit operatively coupled to the differential output amplifier, and having an output corresponding to an output of the amplifier circuit; and a differential amplifier including a first input coupled to the output of the replica bias circuit, a second input for receiving the reference signal, and an output coupled to the differential output amplifier, the differential amplifier at least partially controlling the output common mode voltage of the amplifier circuit in response to a difference between the reference signal coupled to the second control amplifier and the voltage corresponding to an output of the amplifier circuit.

11. In a driver circuit comprising a differential amplifier having a passive element as a bias source for establishing a bias current in the differential amplifier, the differential amplifier including an input stage operatively coupled to a corresponding load device, a method for providing a minimized output common mode voltage in the driver circuit comprising:

generating a feedback control signal corresponding to a difference between a reference signal coupled to the driver circuit and a voltage corresponding to an output voltage of the driver circuit;

establishing an output common mode voltage of the driver circuit by controlling at least a portion of a bias current flowing through at least one of the input stage and the corresponding load device of the differential amplifier in response to the feedback control signal, thereby providing an output voltage at the output of the driver circuit that is substantially independent of an input signal presented to an input of the driver circuit;

generating a second feedback control signal corresponding to a difference between a second reference signal coupled to the driver circuit and a voltage corresponding to the output voltage of the driver circuit; and controlling an output voltage swing of the driver circuit in response to the second feedback control signal.

12. The method of claim 11, wherein the step of generating the feedback control signal comprises the step of:

providing a replica bias circuit, the replica bias circuit being operatively coupled to the differential amplifier and generating the voltage corresponding to an output voltage of the driver circuit.

13. The method of claim 11, wherein the step of establishing an output common mode voltage of the driver circuit comprises the step of:

diverting at least a portion of the bias current flowing through at least one of the input stage and the corresponding load device of the differential amplifier in response to the feedback control signal.

* * * * *